United States Patent
Kaizaki

(12) United States Patent (10) Patent No.: US 7,227,406 B2
Kaizaki (45) Date of Patent: Jun. 5, 2007

(54) DIFFERENTIAL AMPLIFIER FOR BALANCED/UNBALANCED CONVERTER

(75) Inventor: Yasuhiro Kaizaki, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 121 days.

(21) Appl. No.: 11/063,612

(22) Filed: Feb. 24, 2005

(65) Prior Publication Data

US 2005/0200412 A1 Sep. 15, 2005

(30) Foreign Application Priority Data

Mar. 1, 2004 (JP) ............................. 2004-056250
Dec. 7, 2004 (JP) ............................. 2004-353900

(51) Int. Cl.
*G06G 7/12* (2006.01)
(52) U.S. Cl. ...................... 327/563; 330/253
(58) Field of Classification Search ................ 327/563; 330/253
See application file for complete search history.

(56) References Cited

U.S. PATENT DOCUMENTS

| | | | | |
|---|---|---|---|---|
| 4,232,270 A | * | 11/1980 | Marmet et al. | 330/253 |
| 5,682,120 A | * | 10/1997 | Ito | 330/252 |
| 6,150,882 A | * | 11/2000 | Klemmer | 330/253 |
| 6,566,949 B1 | * | 5/2003 | Park | 330/252 |
| 6,566,961 B2 | * | 5/2003 | Dasgupta et al. | 330/301 |

FOREIGN PATENT DOCUMENTS

JP 5-090849 4/1993

* cited by examiner

*Primary Examiner*—Kenneth B. Wells
(74) *Attorney, Agent, or Firm*—McDermott Will & Emery LLP

(57) ABSTRACT

A first field effect transistor receives an unbalanced signal from an input terminal at the gate thereof, and outputs a balanced signal from the drain thereof. A second field effect transistor has the gate thereof connected to the drain of the first field effect transistor and outputs a balanced signal from the drain thereof. The sources of the first field effect transistor and the second field effect transistor are connected to the drain of a third field effect transistor serving as a current source. The drain of the second field effect transistor is connected to the gate of the first field effect transistor via a first resistor. A first output terminal is connected between the drain of the first field effect transistor and the first resistor, and a second output terminal is connected between the drain of the second field effect transistor and a second resistor. Balanced signals produced by conversion in the first field effect transistor and the second field effect transistor are output from the output terminals. The drain of the second field effect transistor is connected to the gate of the first field effect transistor via a feedback resistor.

19 Claims, 9 Drawing Sheets

10

10

DIFFERENTIAL AMPLIFIER FOR BALANCED/UNBALANCED CONVERTER

BACKGROUND OF THE INVENTION

1. Field of the Invention

The present invention relates to a differential amplifier and, more particularly, to a differential amplifier used in a balanced/unbalanced converter circuit.

2. Description of the Related Art

Generally speaking, balanced transmission is used in a circuit for communication. Balanced transmission is known to be highly resistant to noise and adapted to the circuit integration technology in that a differential amplifier not requiring capacitors can be used. In contrast, signal transmission in general, such as antenna transmission, uses unbalanced transmission and therefore requires a converter circuit for conversion between a balanced system and an unbalanced system. A merchant balun, using coupled line segments of a transmission line, and an active balun, using a differential amplifier, are generally used as a balanced/unbalanced converter circuit built in a communication IC. A merchant balun causes a chip area to be increased as a result of using an inductor corresponding to ½ of the wavelength of an operating frequency. In contrast, an active balun can be miniaturized since it usually uses a differential amplifier.

FIG. 1 illustrates the structure of a differential amplifier 10 for a balanced/unbalanced circuit according to the related art. The differential amplifier 10 includes FETs M1 through M3, a resistor R1, a resistor R2, resistors R5 through R8 and a capacitor C2. The sources of the FET M1 and the FET M2 are connected to each other and also to the drain of the FET M3. The FET M3 operates as a current source. The drains of the FET M1 and the FET M2 are connected to a power supply potential VDD via the resistor R1 and the resistor R2, respectively. An unbalanced signal is fed to the gate of the FET M1 via an input terminal 14. The gate of the FET M2 is connected to the ground or a VSS potential via the capacitor C2. The resistors R5 through R8 apply equal bias voltages to the gates of the FET M1 and the FET M2. With such a structure, the input unbalanced signal fed to the gate of the FET M1 is amplified by the FET Ml. Since a constant current flows in the current source constituted by the FET M3, a current 180° phase-shifted with respect to the drain-source current of the FET M1 flows between the drain and the source of the FET M2. Consequently, signals retrieved from a first output terminal 16 and a second output terminal 18 are of the same amplitude in potential and 180° phase-shifted with respect to each other, so as to form balanced signals (See reference (1) in the following Related Art List, for instance).

RELATED ART LIST (1) Japanese Patent Application Laid-Open No. Hei5-90849.

In order to satisfactorily ground the gate of the FET in a high frequency range, the capacitance should be increased, which results in a larger chip area. Further, an ideal grounding condition is hard to obtain due to an inductance component included in the capacitor, and an inductance component included in the ground potential and the VSS potential created by IC patterns and wires. Moreover, balancing of the signals becomes poor in a high frequency range due to parasitic signal components inherent in the FETs.

SUMMARY OF THE INVENTION

The present invention has been done in view of the aforementioned circumstances and its object is to provide a differential amplifier capable of outputting highly balanced signals and enabling miniaturization at the same time.

The present invention according to one aspect provides a differential amplifier. The differential amplifier according to this aspect includes a first FET, a second FET, a current source having one end thereof connected to the source of the first FET and the source of the second FET and the other end thereof connected to a first voltage, and two loads, one being connected between the drain of the first FET and a second voltage, and the other being connected between the drain of the second FET and the second voltage. In this differential amplifier, the drain of the first FET and the gate of the second FET may be connected, and a feedback circuit may be provided between the drain of the second FET and the gate of the first FET.

The first voltage and the second voltage may differ in voltage values. For example, the first voltage may be a power supply voltage and the second voltage may be a ground potential. Alternatively, the second voltage may be a power supply voltage and the first voltage may be a ground potential.

In the differential amplifier described above, the drain of the first FET and the gate of the second FET are connected to each other. The drain of the second FET and the gate of the first FET are connected to each other. It is ensured that the same potential occurs at the gate of the first FET and that of the second FET. There is further provided a feedback circuit between the drain of the second FET and the gate of the first FET in order to prevent leakage of a signal output from the drain of the second FET to the gate of the first FET. As a result, balancing of output signals is improved.

The feedback circuit may be a resistor. The feedback circuit may be an inductor. The feedback circuit may be a series circuit including a resistor and an inductor. There may further be provided a capacitive element connected to the gate of the first FET so that an unbalanced signal is fed to the gate of the first FET via the capacitive element, and a balanced signal is output from the drain of the first FET and the drain of the second FET. There may further be provided an inductor connected in series with the capacitive element. An example of the capacitive element is a capacitor.

The current source may be provided with a third FET. The drain of the third FET may be connected to the source of the first FET and the source of the second FET. The source of the third FET may be connected to the first voltage. The current source may be provided with a resistor. One end of the resistor may be connected to the source of the first FET and the source of the second FET, and the other end thereof maybe connected to the first voltage. The load may be a resistor. The load may be an FET. The load may be a parallel circuit including an inductor and a resistor.

There may be further be provided a source follower circuit connected-to the drain of the first FET, a first output terminal connected to the source follower circuit and a second output terminal connected to the drain of the second FET. The source follower circuit may be provided with an output FET. The source of the output FET may be connected to the first output terminal and also connected to the first voltage via an output load. The gate of the output FET may be connected to the drain of the first FET. The drain of the output FET may be connected to the second voltage. The output load may be a current source using a transistor. The output load may be a resistor.

There may be provided two source follower circuits respectively connected to the drain of the first FET and the drain of the second FET, and two output terminals respectively connected to the two source follower circuits. The two source follower circuits may be provided with a first output FET and a second output FET, respectively. The source of the first output FET may be connected to the first output terminal and also connected to the first voltage via a first output load, the gate of the first output FET may be connected to the drain of the first FET, and the drain of the first output FET may be connected to the second voltage. The source of the second output FET may be connected to the second output terminal and also connected to the first voltage via a second output load, the gate of the second output FET is connected to the drain of the second FET and the drain of the second output FET may be connected to the second voltage. The first output load may be a current source using a transistor. The first output load may be a resistor. The second output load may be a current source using a transistor. The second output load may be a resistor.

Moreover, this summary of the invention does not necessarily describe all necessary features so that the invention may also be sub-combination of these described features.

DETAILED DESCRIPTION OF THE INVENTION

The invention will now be described based on the following examples which do not intend to limit the scope of the present invention but exemplify the invention. All of the features and the combinations thereof described in the examples are not necessarily essential to the invention.

EXAMPLE 1

A summary will be given before describing the present invention in detail. Example 1 of the present invention relates to a differential amplifier used as a balanced/unbalanced converter circuit for converting an input unbalanced signal into a balanced signal. The differential amplifier according to example 1 provides an improvement over the related-art differential amplifier, used as a balanced/unbalanced converter circuit and including a pair of differential transistors FET M1 and FET M2, in that the drain of the FET M1, receiving an unbalanced signal at its gate, is connected to the gate of the FET M2, and the drain of the FET M2 is connected to the gate of the FET M1 via a resistor. Moreover, a balanced signal produced by conversion by the FET M1 and the FET M2 is output from a node between the drain of the FET M1 and a resistor R1 and from a node between the drain of the FET M2 and a resistor R2. With this structure, the capacitor connected to the gate of the FET M2 of the differential amplifier used in a balanced/unbalanced converter circuit according to the related art is removed.

Figure 1:
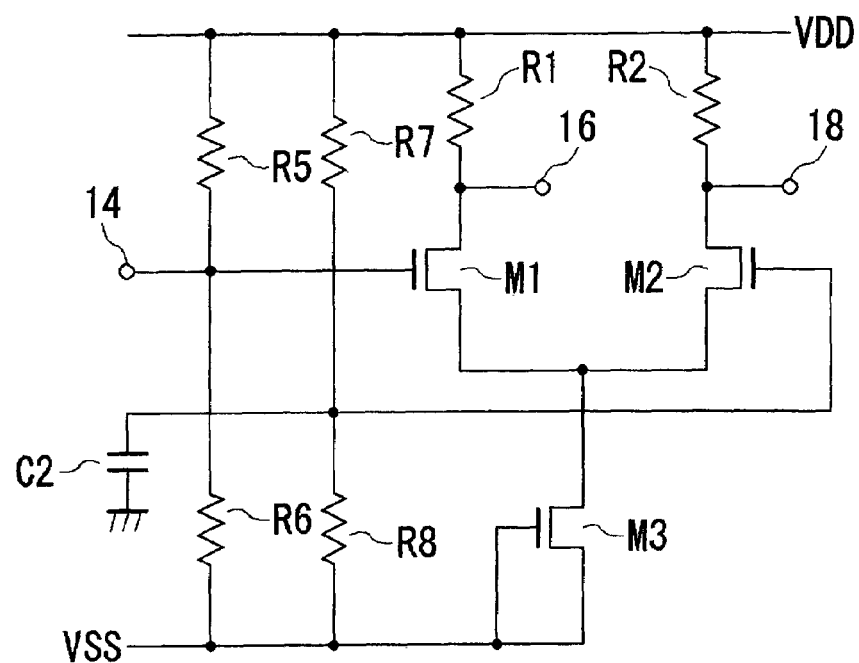
FIG. 1 illustrates the structure of a differential amplifier according to the related art.
Figure 2:
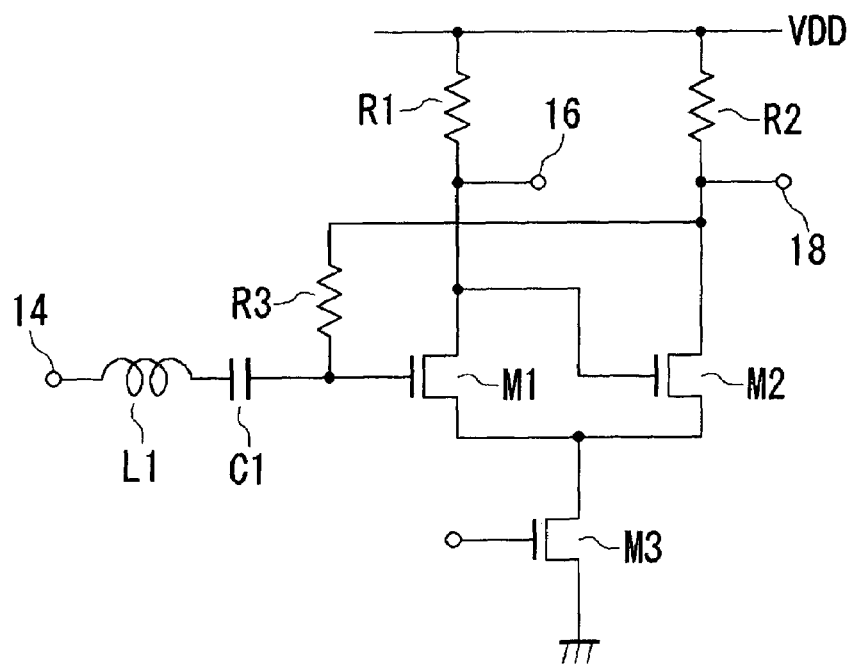
FIG. 2 illustrates the structure of a differential amplifier according to example 1 of the present invention.

FIG. 2 illustrates the structure of a differential amplifier 10 according to example 1 of the present invention. The differential amplifier 10 includes FETs M1 through M3, resistors R1 through R3, an inductor L1 and a capacitor C1.

An unbalanced signal is fed via an input terminal 14. The FET M1 is of a n-type channel. The FET M1 receives the unbalanced signal from the input terminal 14 at its gate and outputs a balanced signal from its drain. The FET M2 is also of a n-type channel. The FET M2 has its gate connected to the drain of the FET M1 and outputs a balanced signal from its drain. The sources of the FET M1 and the FET M2 are connected to the drain of the FET M3 serving as a current source. The source of the FET M3 is connected to the ground potential. The drains of the FET M1 and the FET M2 are connected to a power supply potential VDD via a resistor R1 and a resistor R2, respectively.

Each of the resistors R1 and R2 serves as a load for converting a current signal into a voltage signal. The drain of the FET M2 is connected to the gate of the FET M1 via the resistor R3 serving as a feedback circuit. Further, the inductor L1 and the capacitor C1 connected in series are provided between the gate of the FET M1 and the input terminal 14. A first output terminal 16 is provided between the drain of the FET M1 and the resistor R1, and a second output terminal is provided between the drain of the FET M2 and the resistor R2. The balances signals converted by the FET M1 and the FET M2 are output from the first output terminal 16 and the second output terminal 18, respectively.

In the differential amplifier 10, the gate potential of the FET M1 is equal to the drain potential of the FET M2, and the gate potential of the FET M2 is equal to the drain potential of the FET M1. By configuring the FET M1 and the FET M2 as being of the same size and configuring the resistor R1 and the resistor R1 as being of the same size, it is further ensured that the same potential occurs at the drains, sources and gates of the FET M1 and the FET M2. A resistor requiring a small area in an IC layout is used as the resistor R3 coupled between the drain of the FET M2 and the gate of the FET M1. When a resistor requiring a large area in the layout is used, associated parasitic capacitance causes a signal output from the drain of the FET M2 to be leaked to the gate of the FET M1, thereby causing variation in the potential of balanced output signal.

The inductor L1 is for impedance matching at the input of the FET M1. The inductor may be formed of a pattern or implemented by a wire in an IC. Since an on-chip inductor requires a relatively large area, it may be replaced by a chip inductor provided outside the chip. The capacitor C1 connected in series with the inductor L1 is for cutting a dc component in a bias supplied to the gate of the FET M1.

In the above-described structure of the differential amplifier, the signal fed to the gate of the FET M2 is supplied from the drain of the FET M1. Therefore, a grounding condition does not affect the input to the gate of the FET M2 unlike the case of the related-art balanced/unbalanced circuit in which the gate of the FET M2 is grounded. The gate potential of the FET M1 still differs from that of the FET M2 merely by connecting the drain of the FET M1 connected to the gate of the FET M2. Therefore, the potential of the balanced signal output from the drain of the FET M1 and that of the FET M2 would differ from each other significantly. By establishing a feedback route from the drain of the FET M2 to the gate of the FET M1, it is ensured in the differential amplifier 10 that the gate potential of the FET M1 and that of the FET M2 are equal to each other. When the signal output from the drain of the FET M2 is leaked to the gate of the FET M1, balancing of the signals is lost and oscillation results. To address this, the resistor R3 is introduced between the drain of the FET M2 and the gate of the FET M1. Since the gate resistance of an FET is high, the gate potential of the FET M1 can be maintained equal to the gate potential of the FET M2 even when the resistor R3 is introduced.

Figure 3A:
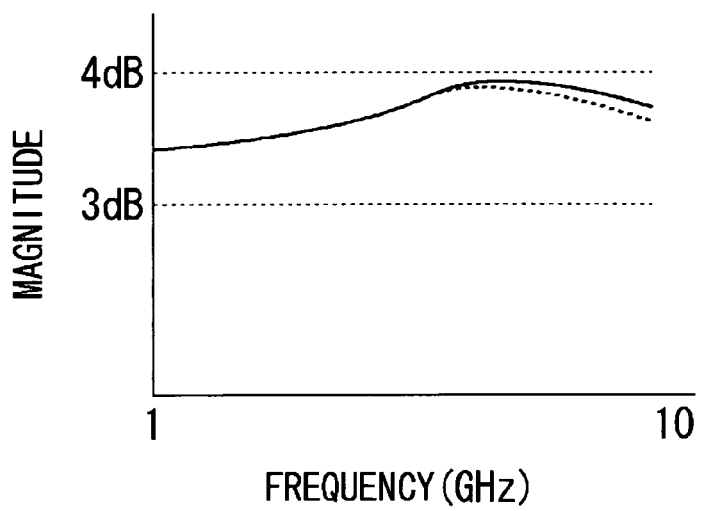
FIGS. 3A–3B are graphical representations of the frequency characteristics of the differential amplifier of FIG. 2.
Figure 3B:
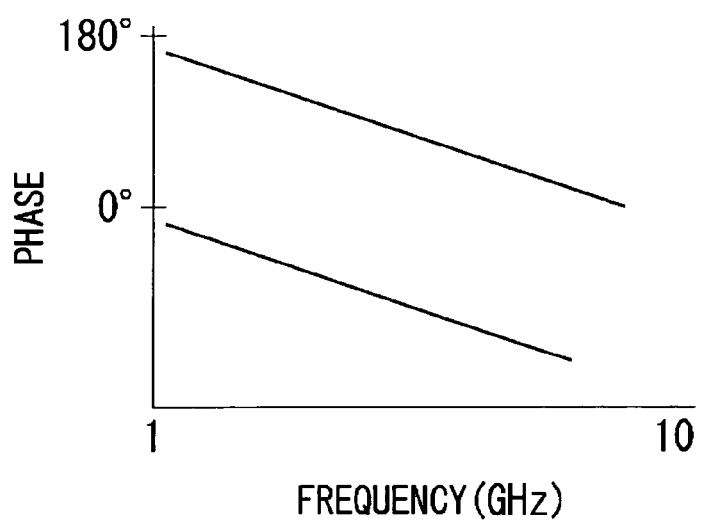

FIGS. 3A–3B are graphical representations of the frequency characteristics of the differential amplifier 10 based on a simulation. FIG. 3A is a graph showing the magnitude of balanced signal versus the frequency. The graph shows the frequency on the horizontal axis and the magnitude expressed in dB on the vertical axis. In a frequency range between 1 GHz and 10 GHz, the magnitude of balanced signal remains practically constant. FIG. 3B is a graph showing the phase of the two balances signals versus the frequency. The graph shows the phase on the vertical axis. In a frequency range between 1 GHz and 10 GHz, the two balanced signals maintain a 180° phase shift with respect to each other. That is, phase reversal is successfully achieved. The results above show that the two balanced signals are highly balanced in respect of signal magnitude and phase.

Figure 4:
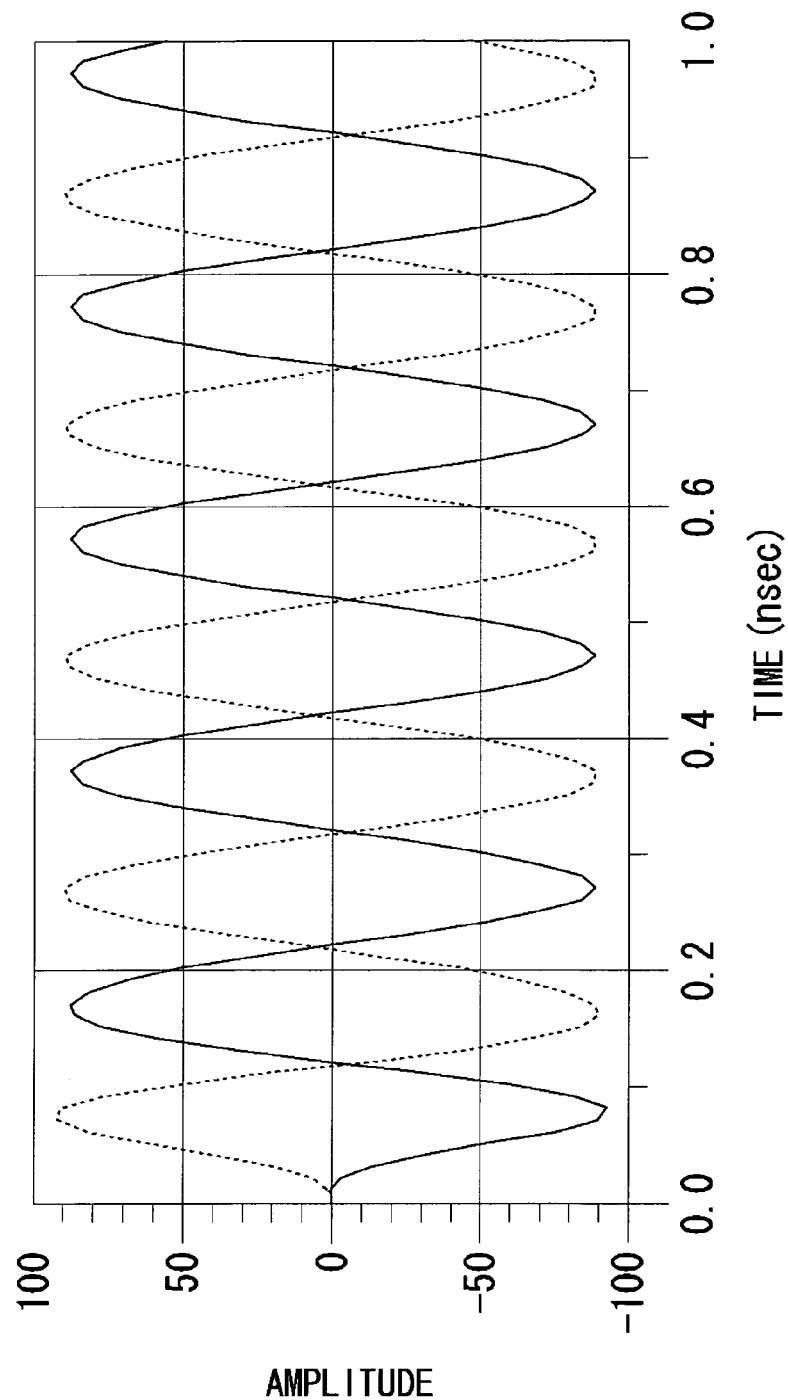
FIG. 4 is a graphical representation of a signal output from the differential amplifier of FIG. 2.

FIG. 4 is a graphical representation of a signal output from the differential amplifier 10 also based on the simulation that produces FIGS. 3A–3B. The graph shows time on the horizontal axis and the amplitude of the two balanced signals on the vertical axis. The two waveforms shown in FIG. 4 are those of balanced signals output from the first output terminal 16 and the second output terminal 16, respectively, in response to an unbalanced sinusoidal signal of a frequency of 5 GHz fed to the input terminal 14. The graph verifies that the two balanced signals are highly balanced in respect of waveform in a time domain.

According to example 1 of the present invention, balanced/unbalanced conversion is not affected by a grounding condition. Therefore, highly balanced signals are obtained. Since a capacitor for grounding is not necessary, the chip area can be reduced. Since highly balanced signals are obtained in an extensive frequency range, example 1 finds applications in a variety of systems and can be practiced in a highly flexible manner.

EXAMPLE 2

In a similar configuration as example 1, example 2 of the present invention relates to a differential amplifier used as a balanced/unbalanced converter circuit for converting an input unbalanced signal into a balanced signal. In the differential amplifier according to example 2, the load coupled between the power supply potential VDD and the FET M1 and the load coupled between the power supply potential VDD and the FET M2 are comprised of an FET.

Figure 5:
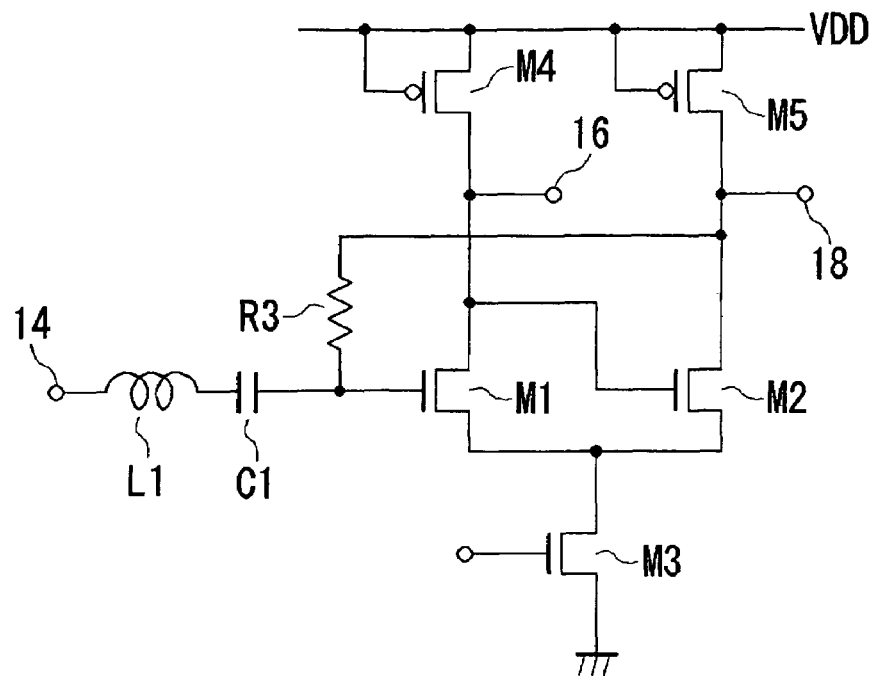
FIG. 5 illustrates the structure of a differential amplifier according to example 2 of the present invention.

FIG. 5 illustrates the structure of the differential amplifier 10 according to example 2 of the present invention. A difference from the differential amplifier 10 of FIG. 2 is that an FET M4 and an FET M5 are provided in place of the resistor R1 and the resistor R2, respectively.

Normally, the FET M4 and the FET M5 are of a p-type channel. Like the resistors R1 and R2 of FIG. 2, the FET M4 and the FET M5 operate as a load for converting a current signal into a voltage signal.

According to example 2, the load is comprised of an FET as a constant current source. At high frequencies, the FET presents high impedance so that the gain of the output signal can be increased.

EXAMPLE 3

In a similar configuration as the above-described examples, example 3 relates to a different amplifier used as a balanced/unbalanced converter circuit for converting an input unbalanced signal into a balanced signal. In the differential amplifier according to example 3, the current source is comprised of a resistor.

Figure 6:
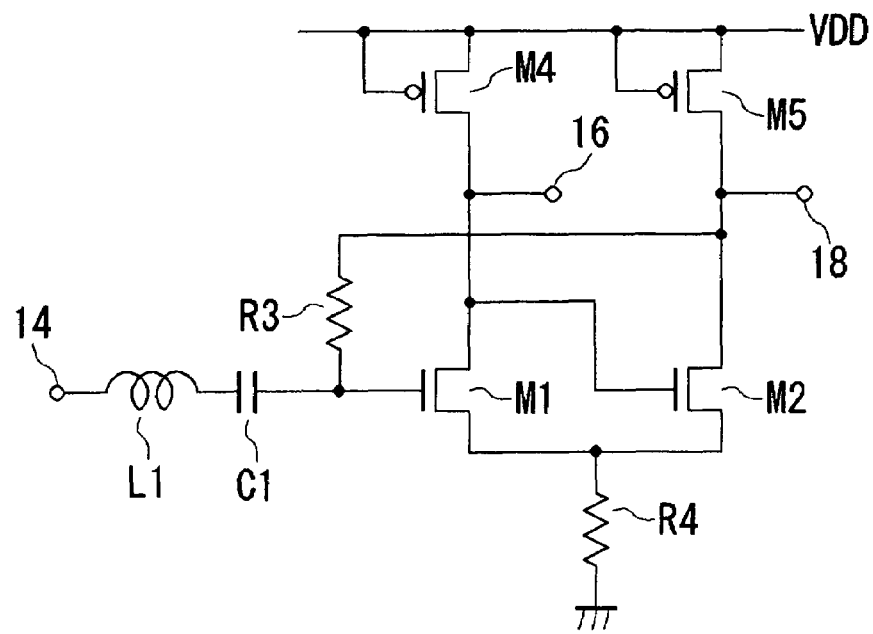
FIG. 6 illustrates the structure of a differential amplifier according to example 3 of the present invention.

FIG. 6 illustrates the structure of the differential amplifier 10 according to example 3 of the present invention. A difference from the differential amplifier 10 of FIG. 5 is that a resistor R4 is provided in place of the FET M3.

The resistor R4 is provided as a current source. As illustrated, one end of the resistor R4 is connected to the source of the FET M1 and the source of the FET M2. The other end of the resistor R4 is connected to the ground potential.

According to example 3, the resistor, instead of an FET, is used as a current source so that it is not necessary to provide a gate voltage for the FET. Since the gate voltage of an FET as a current source is unnecessary, the power supply voltage can be lowered. Since the power supply voltage can be lowered, the differential amplifier can be used in a situation where a high power supply voltage cannot be set.

EXAMPLE 4

In a similar configuration as the above-described examples, example 4 relates to a different amplifier used as a balanced/unbalanced converter circuit for converting an input unbalanced signal into a balanced signal. In the differential amplifier according to example 4, the feedback circuit is comprised of an inductor.

Figure 7:
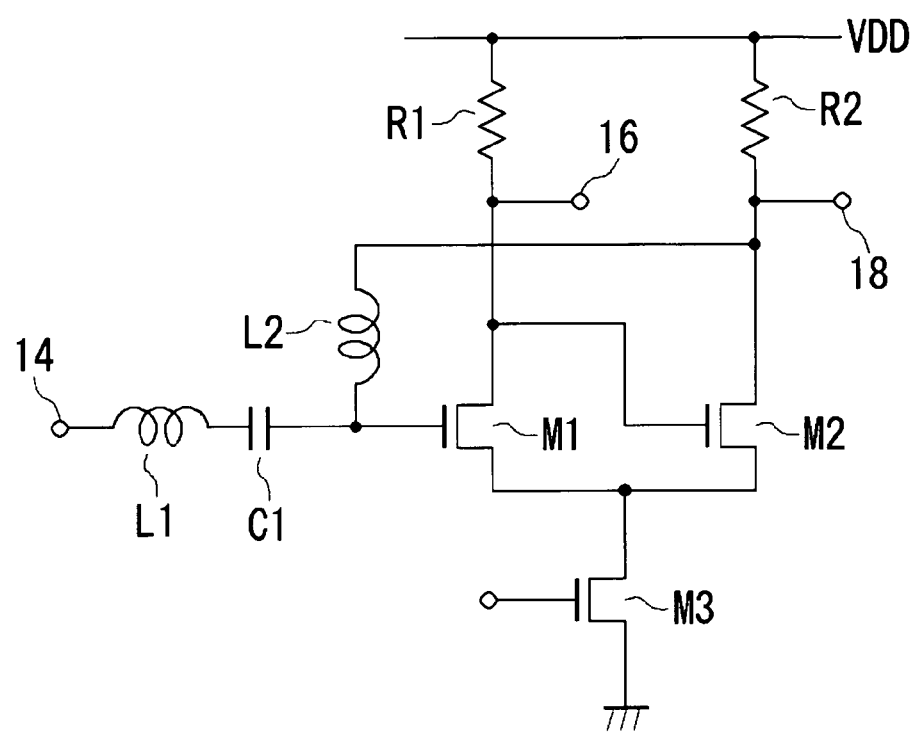
FIG. 7 illustrates the structure of a differential amplifier according to example 4 of the present invention.

FIG. 7 illustrates the structure of the differential amplifier 10 according to example 4 of the present invention. A difference from the differential amplifier 10 of FIG. 5 is that an inductor L2 is provided in place of the resistor R3.

The inductor L2 is provided as a feedback circuit. Generally, the characteristics of an inductor differ from those of a resistor and are largely dependent on frequency. Therefore, the drain of the FET M2 is electrically connected to the gate of the FET M1 only at frequencies defined by the inductor L2.

Since an inductor is used in the feedback circuit from the drain of the FET M2 to the gate of the FET M1 according to example 4, the output balanced signals are provided with frequency characteristics. Further, highly balanced signals can be output in a specific frequency range. Moreover, signal balancing of the output signals can be made poor in a specific frequency range.

EXAMPLE 5

In a similar configuration as the above-described examples, example 5 of the present invention relates to a differential amplifier used as a balanced/unbalanced converter circuit for converting an input unbalanced signal into a balanced signal. In the differential amplifier according to the above-described examples, the drain of the FET M1 is connected to the gate of the FET M2, and the drain of the FET M2 is connected to the gate of the FET M1 via a feedback circuit. In this way, it is ensured that highly balanced signals are output. That is, the two outputs from the differential amplifier have the identical levels. However, the impedance at the output terminal connected to the drain of the FET M1 may differ from the impedance at the output terminal connected to the drain of the FET M2. The impedance levels differ as a result of the drain of the FET M2 being connected to the feedback circuit. The difference in the impedance levels results in different loads occurring at the two output terminals. As a result of this, the voltage levels of the balanced signals impressed on the two output terminals differ. In the differential amplifier according to example 5, a source follower circuit is connected at least to the drain of the FET M1, and the output terminal is connected to the source follower circuit. The source follower circuit operates for impedance adjustment.

Figure 8:
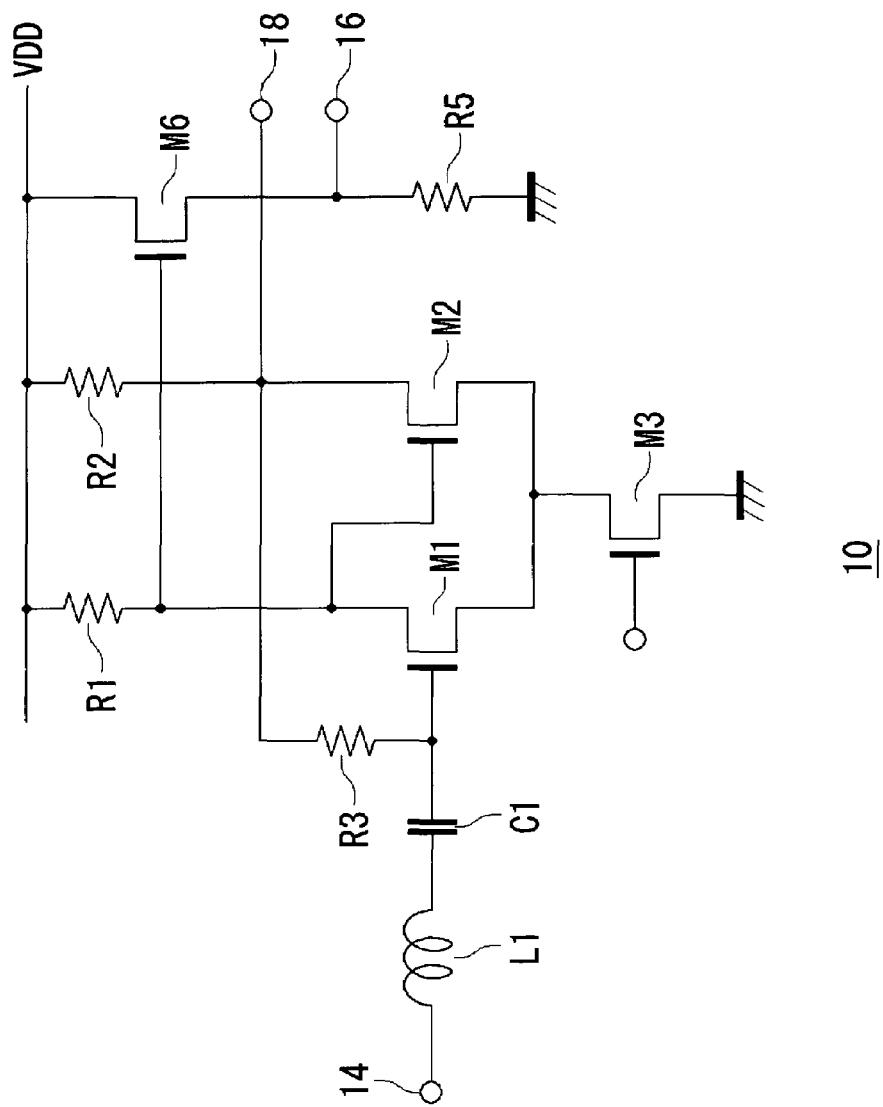
FIG. 8 illustrates the structure of a differential amplifier according to example 5 of the present invention.

FIG. 8 illustrates the structure of the differential amplifier 10 according to example 5 of the present invention. In addition to the elements of the differential amplifier of FIG. 2, the differential amplifier 10 of FIG. 8 includes an FET M6 and a resistor R5. Those parts of the differential amplifier 10 already illustrated in FIG. 2 are the same as the corresponding parts in example 1 so that a description thereof is omitted. The source follower circuit comprised of the FET M6 and the resistor R5 is connected to the drain of the FET M1. Further, the source follower circuit is connected to the first output terminal 16. The drain of the FET M2 is connected to the second output terminal 18.

The gate of the FET M6 is connected to the drain of the first FET. Further, the drain of the FET M6 is connected to the power supply potential VDD. Moreover, the source of the FET M6 is connected to the first output terminal 16 and also connected to the ground potential via the resistor R5. By adjusting the value of the resistor R5 in this structure, the impedance occurring at the first output terminal 16 is adjusted. The value of the resistor R5 is adjusted so that the impedance at the first output terminal 16 approximates the impedance at the second output terminal 18. While the load is described as being implemented by the resistor R5, a current source using a transistor may be used instead.

Figure 9:
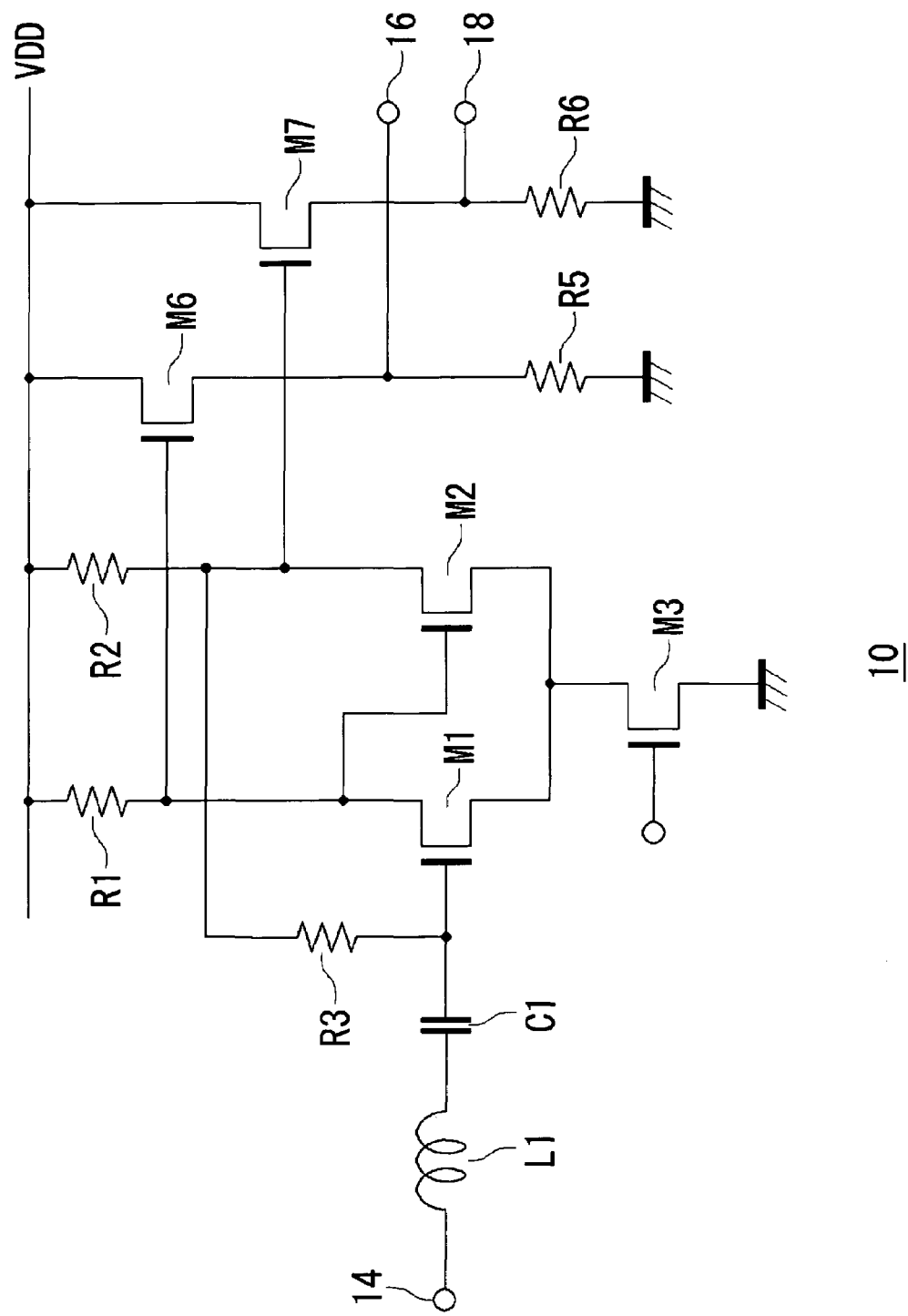
FIG. 9 illustrates the structure of a differential amplifier according to a variation of example 5 of the present invention.

FIG. 9 illustrates the structure of the differential amplifier 10 according to a variation of example 5 of the present invention. In addition to the elements of the differential amplifier 10 of FIG. 8, the differential amplifier of FIG. 9 includes an FET M7 and a resistor R6. A difference from the differential amplifier 10 of FIG. 8 is that a source follower circuit is also connected to the drain of the FET M2 of the differential amplifier 10 of FIG. 9. The source follower circuit comprised of the FET M7 and the resistor R6 is connected to the drain of the FET M2. The source follower circuit is connected to the second output terminal 18. The drains of the FET M1 and the FET M2 are connected to the respective source follower circuits.

The gate of the FET M7 is connected to the drain of the second FET. The drain of the FET M7 is connected to the power supply potential. The source of the FET M7 is connected to the second output terminal and also connected to the ground potential via the resistor R6. By adjusting the value of the resistor R6 in this structure, the impedance occurring at the second output terminal 18 is adjusted. Since the impedance at the first output terminal 16 is adjusted by adjusting the value of the resistor R5, the impedance at the first output terminal 16 and the impedance at the second output terminal 18 can be set to values which approximate each other, by adjusting the values of the resistor R5 and the resistor R6. As mentioned above, while the load is described as being implemented by the resistor R6, a current source using a transistor may be used instead.

Since the source follower circuit is provided at the output of the differential amplifier, adjustment for impedance matching between balanced signals is possible. Since adjustment for impedance matching between balanced signals is possible, the voltages of the balanced signals can be adjusted to match each other. Adjustment of impedance is effected by adjusting the value of loads. By providing one source follower circuit, adjustment for applying impedance matching to balanced signals can be effected, while ensuring that the circuit scale is prevented from being increased. By providing two source follower circuits, adjustment of impedance is made easy by using the circuits for impedance adjustment. Another benefit from providing the two source follower circuits is that a range for adjustment is extended. Still another benefit from providing the two source follower circuits is that symmetry of the circuit is improved so that fabrication of the circuit becomes more efficient.

EXAMPLE 6

Example 6 of the present invention relates to a communication apparatus using the differential amplifier described above used as a balanced/unbalanced circuit.

Figure 10:
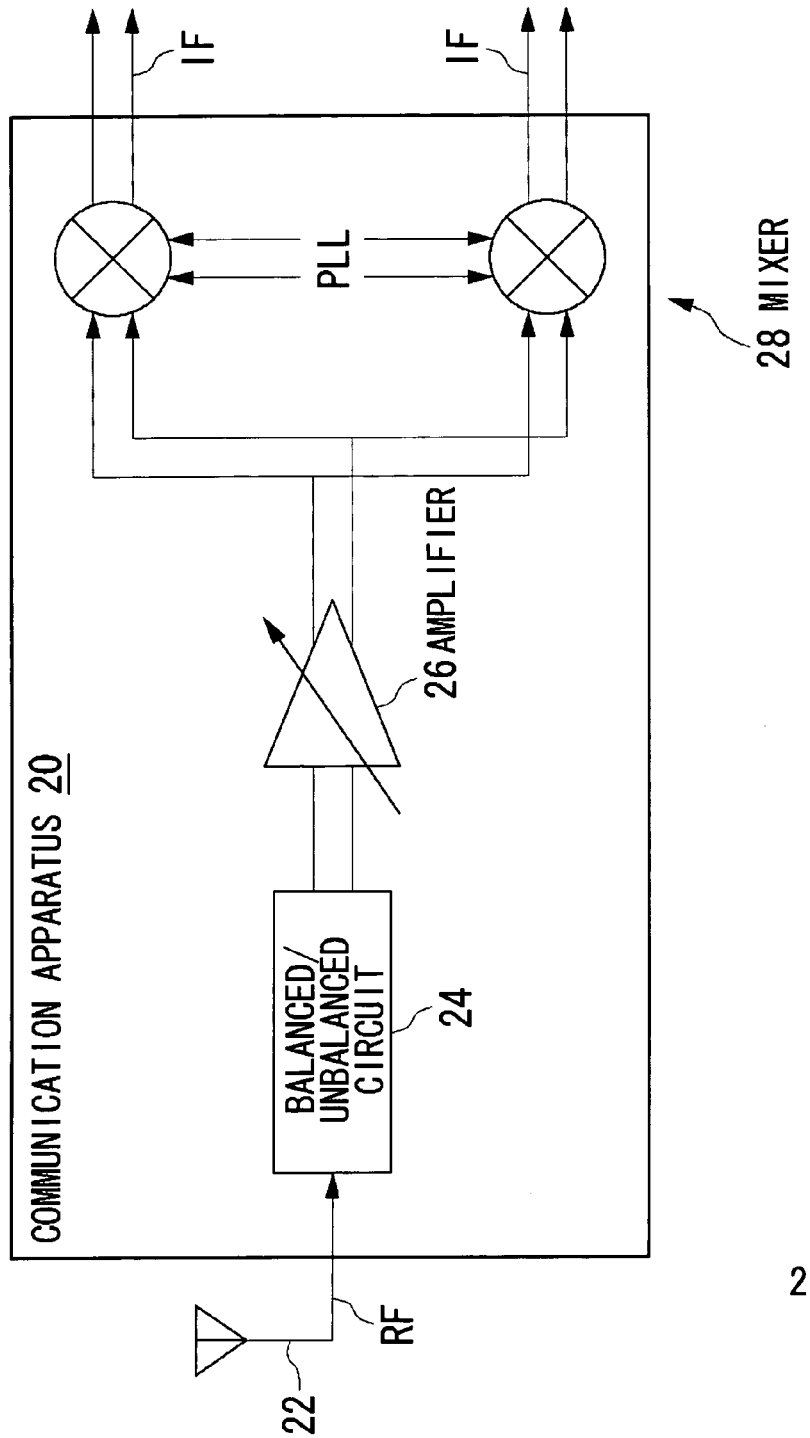
FIG. 10 illustrates a communication apparatus according to example 6 of the present invention.

FIG. 10 illustrates a communication apparatus 20 according to example 6 of the present invention. The communication apparatus 20 of FIG. 10 is for reception in general. The communication apparatus 20 may be comprised of a single IC circuit. The communication apparatus 20 is provided with a plurality of circuits providing communication functions, including a balanced/unbalanced converter circuit 24, an amplifier 26 and a mixer 28 connected in series. The amplifier 26 is a low-noise amplifier (LNA) for amplifying a received signal. The balanced/unbalanced circuit 24 is an active balun for converting an unbalanced signal into a balanced signal. The mixer 28 is a Gilbert cell mixer for conversion between a radio frequency and a modulated/demodulated signal. Demodulating circuits and the like (not shown) are provided subsequent to the communication apparatus 20.

According to example 5, the differential amplifier used as a balanced/unbalanced circuit is applicable to the communication apparatus.

Described above is an explanation based on the embodiment. The description of the embodiment is illustrative in nature and various variations in constituting elements and processes involved are possible. Those skilled in the art would readily appreciate that the variations are also within the scope of the present invention.

Figure 11:
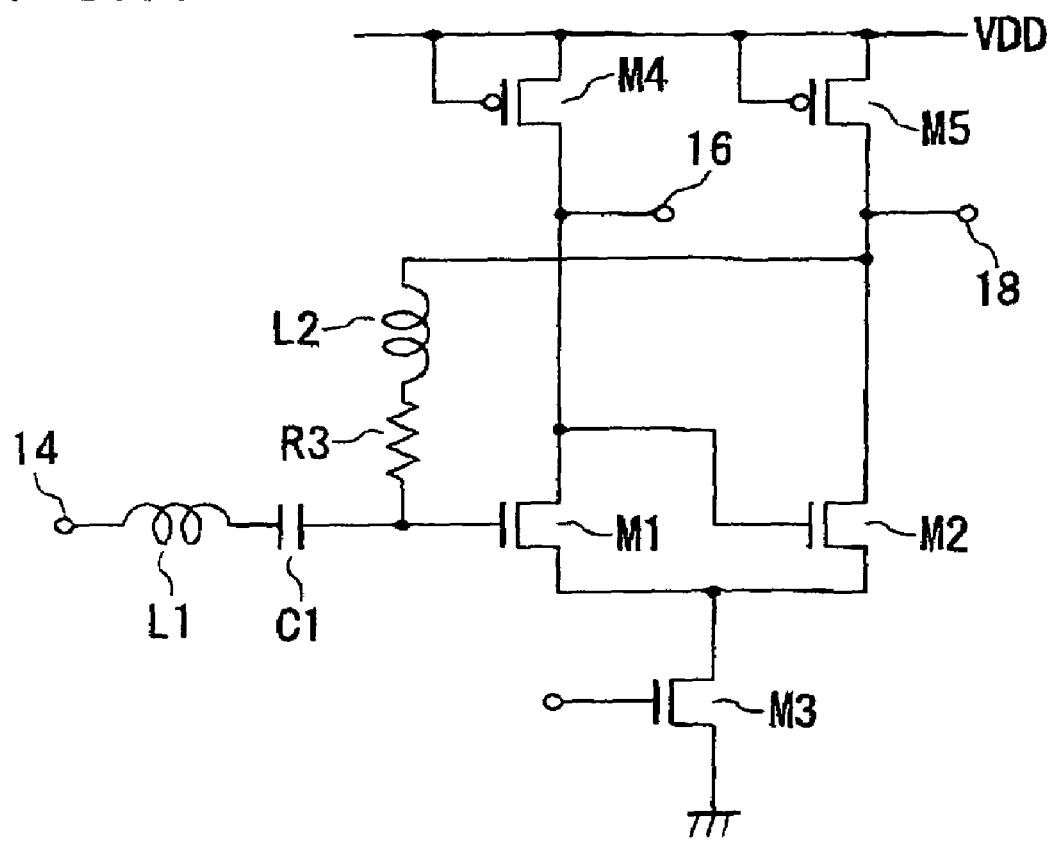
FIG. 11 illustrates the structure of a modified differential amplifier according to the present invention.

In examples 1 through 5, the feedback circuit is formed of the resistor R3 or the inductor L2. Alternatively, the feedback circuit may be formed of a series circuit including the resistor R3 and the inductor L2, as shown in FIG. 11. According to this variation, the combined benefits from examples 1 thorough 3 and example 4 are obtained. This will meet the requirement is that the signal output from the drain of the FET M2 is prevented from being leaked to the gate of the FET M1.

In examples 1 through 5, the load coupled between the power supply voltage and the drain of the FET M1 is implemented by the resistor R1 or the FET M4, and the load coupled between the power supply voltage and the drain of the FET M2 is implemented by the resistor R2 or the FET M5. Alternatively, a parallel circuit including an inductor and a resistor may be coupled between the power supply voltage and the drain of the transistor. According to this variation, the output balanced signals are provided with frequency characteristics due to the frequency characteristics of inductor. This will meet the requirement that voltage signals are output as balanced signals.

Although the present invention has been described by way of exemplary embodiments, it should be understood that many changes and substitutions may further be made by those skilled in the art without departing from the scope of the present invention which is defined by the appended claims.

What is claimed is:

1. A differential amplifier comprising:
    a first field effect transistor;
    a second field effect transistor;
    a current source having one end thereof connected to the source of said first field effect transistor and the source of said second field effect transistor, and having the other end of said current source connected to a first voltage; and
    two loads, one being connected between the drain of said first field effect transistor and a second voltage, and the other being connected between the drain of said second field effect transistor and the second voltage, wherein
    the drain of said first field effect transistor and the gate of said second field effect transistor are connected to each other, and a feedback circuit is provided between the drain of said second field effect transistor and the gate of said first field effect transistor, and
    said feedback circuit is a resistor.

2. The differential amplifier according to claim 1, further comprising a capacitive element connected to the gate of said first field effect transistor, wherein an unbalanced signal is fed to the gate of said first field effect transistor via said capacitive element and a balanced signal is output from the drain of said first field effect transistor and the drain of said second field effect transistor.

3. The differential amplifier according to claim 1, further comprising a capacitive element connected to the gate of said first field effect transistor, and
    an inductor connected in series with said capacitive elements,
    wherein an unbalanced signal is fed to the gate of said first field effect transistor via said capacitive element and a balanced signal is output from the drain of said first field effect transistor and the drain of said second field effect transistor.

4. The differential amplifier according to claim 1, further comprising:
    a source follower circuit connected to the drain of said first field effect transistor;
    a first output terminal connected to said source follower circuit; and
    a second output terminal connected to the drain of said second field effect transistor.

5. The differential amplifier according to claim 4, wherein said source follower circuit is provided with an output field effect transistor, the source of said output field effect transistor is connected to said first output terminal and also connected to said first voltage via an output load, the gate of said output field effect transistor is connected to the drain of said first field effect transistor, and the drain of said output field effect transistor is connected to said second voltage.

6. The differential amplifier according to claim 1, further comprising:
    two source follower circuits respectively connected to the drain of said first field effect transistor and the drain of said second field effect transistor and two output terminals respectively connected to said two source follower circuits.

7. The differential amplifier according to claim 6, wherein said two source follower circuits are provided with a first output field effect transistor and a second output field effect transistor, respectively, the source of said first output field effect transistor is connected to said first output terminal and also connected to said first voltage via a first output load, the gate of said first output field effect transistor is connected to the drain of said first field effect transistor, the drain of said first output field effect transistor is connected to the second voltage, the source of said second output field effect transistor is connected to said second output terminal and also connected to said first voltage via a second output load, the gate of said second output field effect transistor is connected to the drain of said second field effect transistor and the drain of said second output field effect transistor is connected to said second voltage.

8. A differential amplifier comprising:
    a first field effect transistor;
    a second field effect transistor;
    a current source having one end thereof connected to the source of said first field effect transistor and the source of said second field effect transistor, and having the other end of said current source connected to a first voltage; and
    two loads, one being connected between the drain of said first field effect transistor and a second voltage, and the other being connected between the drain of said second field effect transistor and the second voltage, wherein
    the drain of said first field effect transistor and the gate of said second field effect transistor are connected to each other, and a feedback circuit is provided between the drain of said second field effect transistor and the gate of said first field effect transistor, and
    said feedback circuit is an inductor.

9. The differential amplifier according to claim 8, further comprising a capacitive element connected to the gate of said first field effect transistor, wherein an unbalanced signal is fed to the gate of said first field effect transistor via said capacitive element and a balanced signal is output from the drain of said first field effect transistor and the drain of said second field effect transistor.

10. The differential amplifier according to claim 8, further comprising:
    a source follower circuit connected to the drain of said first field effect transistor;
    a first output terminal connected to said source follower circuit; and
    a second output terminal connected to the drain of said second field effect transistor.

11. The differential amplifier according to claim 10, wherein
    said source follower circuit is provided with an output field effect transistor, the source of said output field effect transistor is connected to said first output terminal and also connected to said first voltage via an output load, the gate of said output field effect transistor is connected to the drain of said first field effect transistor, and the drain of said output field effect transistor is connected to said second voltage.

12. The differential amplifier according to claim 8, further comprising:
    two source follower circuits respectively connected to the drain of said first field effect transistor and the drain of said second field effect transistor; and two output terminals respectively connected to said two source follower circuits.

13. The differential amplifier according to claim 12, wherein said two source follower circuits are provided with a first output field effect transistor and a second output field effect transistor, respectively, the source of said first output field effect transistor is connected to said first output terminal and also connected to said first voltage via a first output load, the gate of said first output field effect transistor is connected to the drain of said first field effect transistor, the drain of said first output field effect transistor is connected to the second voltage, the source of said second output field effect transistor is connected to said second output terminal and also connected to said first voltage via a second output load, the gate of said second output field effect transistor is connected to the drain of said second field effect transistor and the drain of said second output field effect transistor is connected to said second voltage.

14. A differential amplifier comprising:
a first field effect transistor;
a second field effect transistor;
a current source having one end thereof connected to the source of said first field effect transistor and the source of said second field effect transistor, and having the other end of said current source connected to a first voltage; and
two loads, one being connected between the drain of said first field effect transistor and a second voltage, and the other being connected between the drain of said second field effect transistor and the second voltage, wherein the drain of said first field effect transistor and the gate of said second field effect transistor are connected to each other, and a feedback circuit is provided between the drain of said second field effect transistor and the gate of said first field effect transistor, and
said feedback circuit is a series circuit including a resistor and an inductor.

15. The differential amplifier according to claim 14, further comprising a capacitive element connected to the gate of said first field effect transistor, wherein an unbalanced signal is fed to the gate of said first field effect transistor via said capacitive element and a balanced signal is output from the drain of said first field effect transistor and the drain of said second field effect transistor.

16. The differential amplifier according to claim 14, further comprising:
a source follower circuit connected to the drain of said first field effect transistor;
a first output terminal connected to said source follower circuit; and
a second output terminal connected to the drain of said second field effect transistor.

17. The differential amplifier according to claim 16, wherein
said source follower circuit is provided with an output field effect transistor, the source of said output field effect transistor is connected to said first output terminal and also connected to said first voltage via an output load, the gate of said output field effect transistor is connected to the drain of said first field effect transistor, and the drain of said output field effect transistor is connected to said second voltage.

18. The differential amplifier according to claim 14, further comprising:
two source follower circuits respectively connected to the drain of said first field effect transistor and the drain of said second field effect transistor; and
two output terminals respectively connected to said two source follower circuits.

19. The differential amplifier according to claim 18, wherein said two source follower circuits are provided with a first output field effect transistor and a second output field effect transistor, respectively, the source of said first output field effect transistor is connected to said first output terminal and also connected to said first voltage via a first output load, the gate of said first output field effect transistor is connected to the drain of said first field effect transistor, the drain of said first output field effect transistor is connected to the second voltage, the source of said second output field effect transistor is connected to said second output terminal and also connected to said first voltage via a second output load, the gate of said second output field effect transistor is connected to the drain of said second field effect transistor and the drain of said second output field effect transistor is connected to said second voltage.

* * * * *